(12) United States Patent
Zhao et al.

(10) Patent No.: US 8,601,325 B2
(45) Date of Patent: Dec. 3, 2013

(54) TEST DATA MANAGEMENT SYSTEM AND METHOD

(75) Inventors: Zhi-Yong Zhao, Shenzhen (CN); Tai-Chen Wang, New Taipei (TW); Lei Ye, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 189 days.

(21) Appl. No.: 13/245,877

(22) Filed: Sep. 27, 2011

(65) Prior Publication Data
US 2012/0221894 A1   Aug. 30, 2012

(30) Foreign Application Priority Data
Feb. 24, 2011   (CN) .............................. 2011 1 004464

(51) Int. Cl.
*G06F 11/00*   (2006.01)
(52) U.S. Cl.
USPC ................... 714/45; 714/47.1; 714/25; 714/2

(58) Field of Classification Search
USPC .................................. 714/25, 47.1, 45, 48, 2
See application file for complete search history.

(56) References Cited

U.S. PATENT DOCUMENTS

| | | | | |
|---|---|---|---|---|
| 2004/0006546 | A1* | 1/2004 | Wedlake et al. | 706/46 |
| 2009/0199047 | A1* | 8/2009 | Vaitheeswaran et al. | 714/47 |
| 2011/0145652 | A1* | 6/2011 | Sukendro | 714/38.1 |

* cited by examiner

*Primary Examiner* — Sarai Butler
(74) *Attorney, Agent, or Firm* — Altis & Wispro Law Group, Inc.

(57) ABSTRACT

In a test data management method, an electronic signal that needed to be tested of an electronic device is select. A predefined template file of a test report of the electronic signal is generated. Test data of the electronic signal is obtained from a test file, and is inserted into predetermined locations of the template file. The test report of the electronic signal is generated according to the template file and the inserted test data, and the test report is stored into a storage system of a computing device.

15 Claims, 4 Drawing Sheets

TEST DATA MANAGEMENT SYSTEM AND METHOD

BACKGROUND

1. Technical Field

Embodiments of the present disclosure relate generally to data management technologies, and particularly to a test data management system and method.

2. Description of Related Art

Tests of electronic signals of electronic devices, such as bus signals and power signals of computers, are very important during the research and manufacturing of the electronic devices. Test results of the electronic signals may include a large amount of test data, such as test values and test graphs (e.g., oscillograms of the electronic signals). The test data may be manually transcribed into a predefined file to generate a test report. Such transcription is not only time-consuming but also prone to error.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
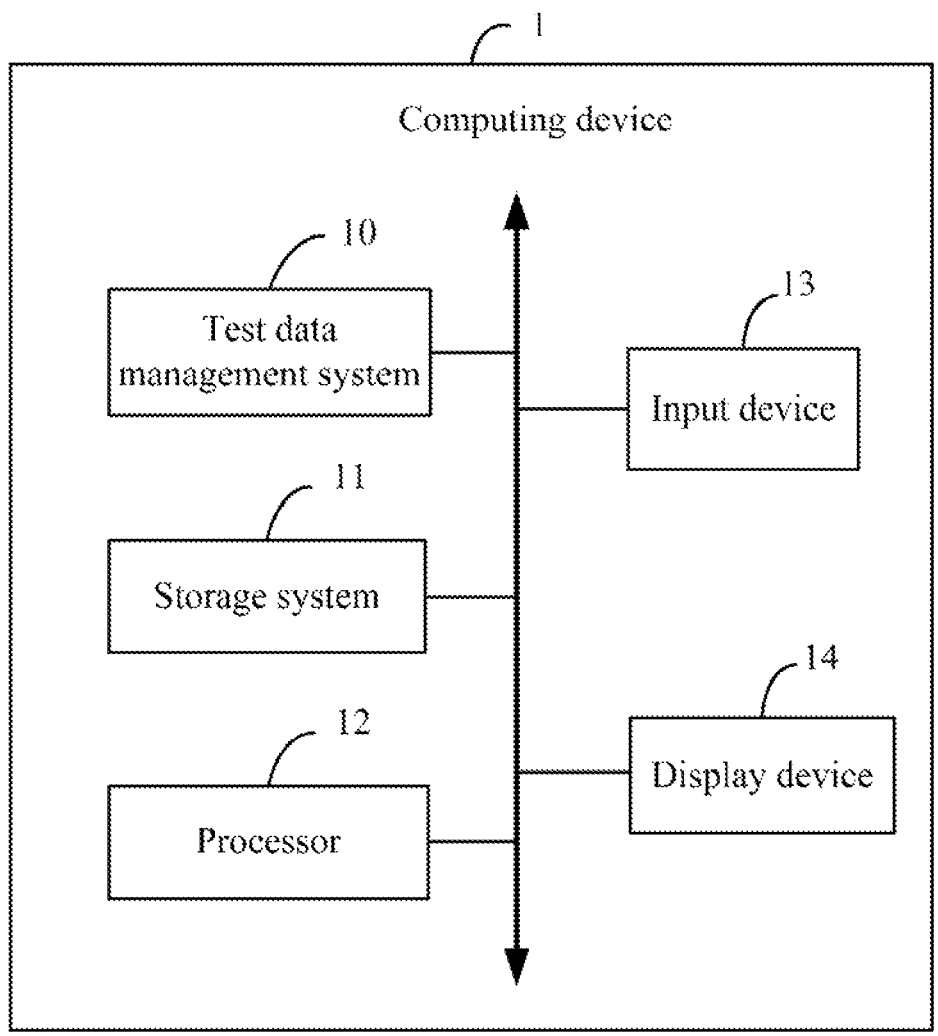
FIG. 1 is a block diagram of one embodiment of a computing device including a test data management system.

FIG. 1 is a block diagram of one embodiment of a computing device 1 including a test data management system 10. The computing device 1 further includes a storage system 11, a processor 12, an input device 13, and a display device 14. It is understood that FIG. 1 is only one example of the computing device 1 that can include more or fewer components than those shown in the embodiment, or a different configuration of the various components.

The storage system 11 stores one or more programs, such as programs of a firmware or other applications of the computing device 1, and executed by the processor 12 to provide functions of the computing device 1. In one embodiment, the storage system 11 may be a random access memory (RAM) for temporary storage of information, and/or a read only memory (ROM) for permanent storage of information. In other embodiments, the storage system 11 may also be an external storage device, such as a hard disk, a storage card, or a data storage medium.

Figure 2:
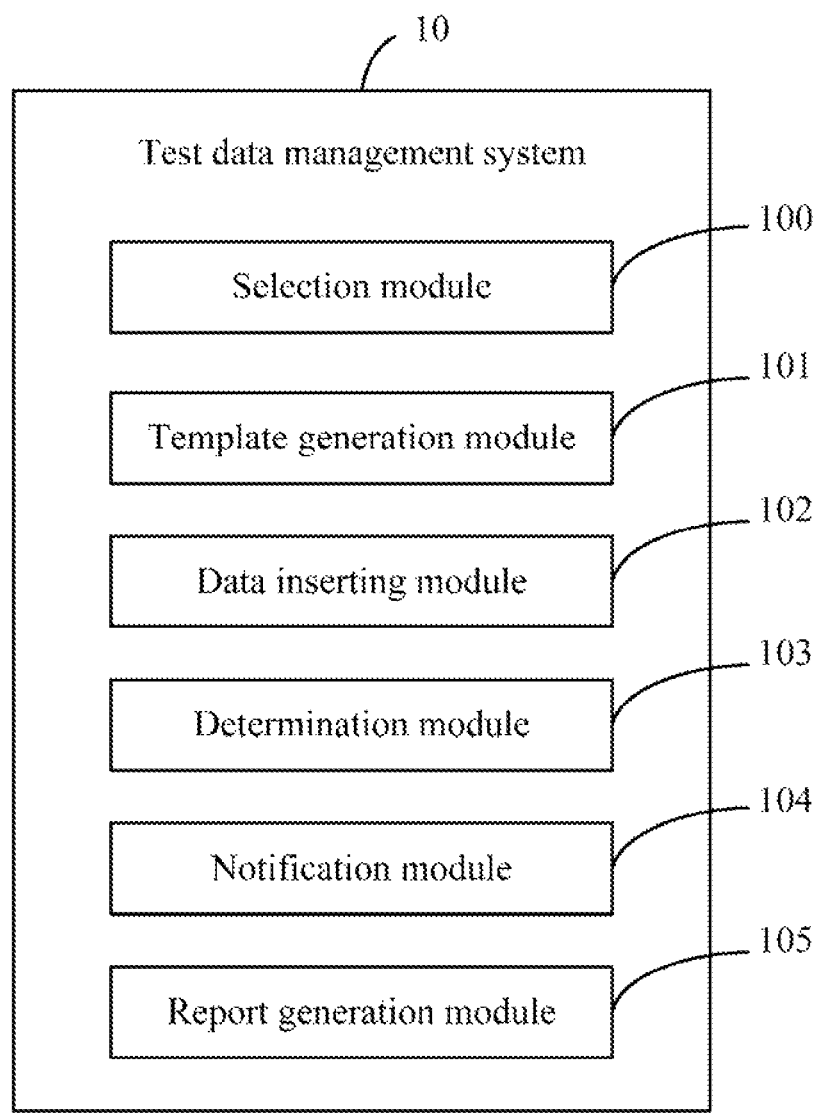
FIG. 2 is a block diagram of functional modules of the test data management system of FIG. 1.

FIG. 2 is a block diagram of functional modules of the test data management system 10. In one embodiment, the test data management system 10 may include a plurality of software programs in the form of one or more computerized instructions stored in the storage system 11, and executed by the processor 12, to perform operations of the computing device 1. In the embodiment, the test data management system 10 includes a selection 100, a template generation module 101, a data inserting module 102, a determination module 103, a notification module 104, and a report generation module 105. In general, the word "module", as used herein, refers to logic embodied in hardware or firmware, or to a collection of software instructions, written in a programming language, such as, Java, C, or assembly. One or more software instructions in the modules may be embedded in firmware, such as in an EPROM. The modules described herein may be implemented as either software and/or hardware modules and may be stored in any type of non-transitory computer-readable medium or other storage device. Some non-limiting examples of non-transitory computer-readable medium include CDs, DVDs, BLU-RAY, flash memory, and hard disk drives.

The selection 100 selects an electronic signal that needs to be tested of an electronic device. The electronic device includes, but is not limited to, a mobile phone, a personal digital assistant (PDA), and a notebook. In the embodiment, the electronic signal may be, for example, a digital visual interface (DVI) signal, a universal serial bus (USB) signal, a local area network (LAN) signal, or a video graphics array (VGA) signal of the electronic device. A test file is generated and stored in the storage system 11 after the electronic signal is tested. The test file includes a large amount of test data, such as test values and test graphs of the electronic signal. In one example, the test data may include a maximum value and a minimum value of an output voltage of a power supply of the electronic device. The test graphs may include one or more images of waveforms of the output voltage. The test file may be a hypertext markup language (HTML) file.

The template generation module 101 generates a predefined template file used for generating a test report of the electronic signal. In the embodiment, the template file may be an EXCEL file.

The data inserting module 102 obtains test data of the electronic signal from the test file, and inserts the test data into predetermined locations of the template file. Details of obtaining the test data and inserting the test data are described as the following descriptions of FIG. 4.

The determination module 103 determines whether the test data is successfully inserted into the template file. If the test data is successfully inserted into the template file, the notification module 104 generates messages indicating that the test data has been inserted into the template file. If the test data fails to be inserted into the template file, the notification module 104 generates messages indicating that the test data has not been inserted into the template file.

The report generation module 105 generates a test report of the electronic signal according to the template file when the test data has been inserted into the template file. When the test report is generated, the report generation module 105 stores the test report into the storage system 11, and displays the test report on the display device 13.

Figure 3:
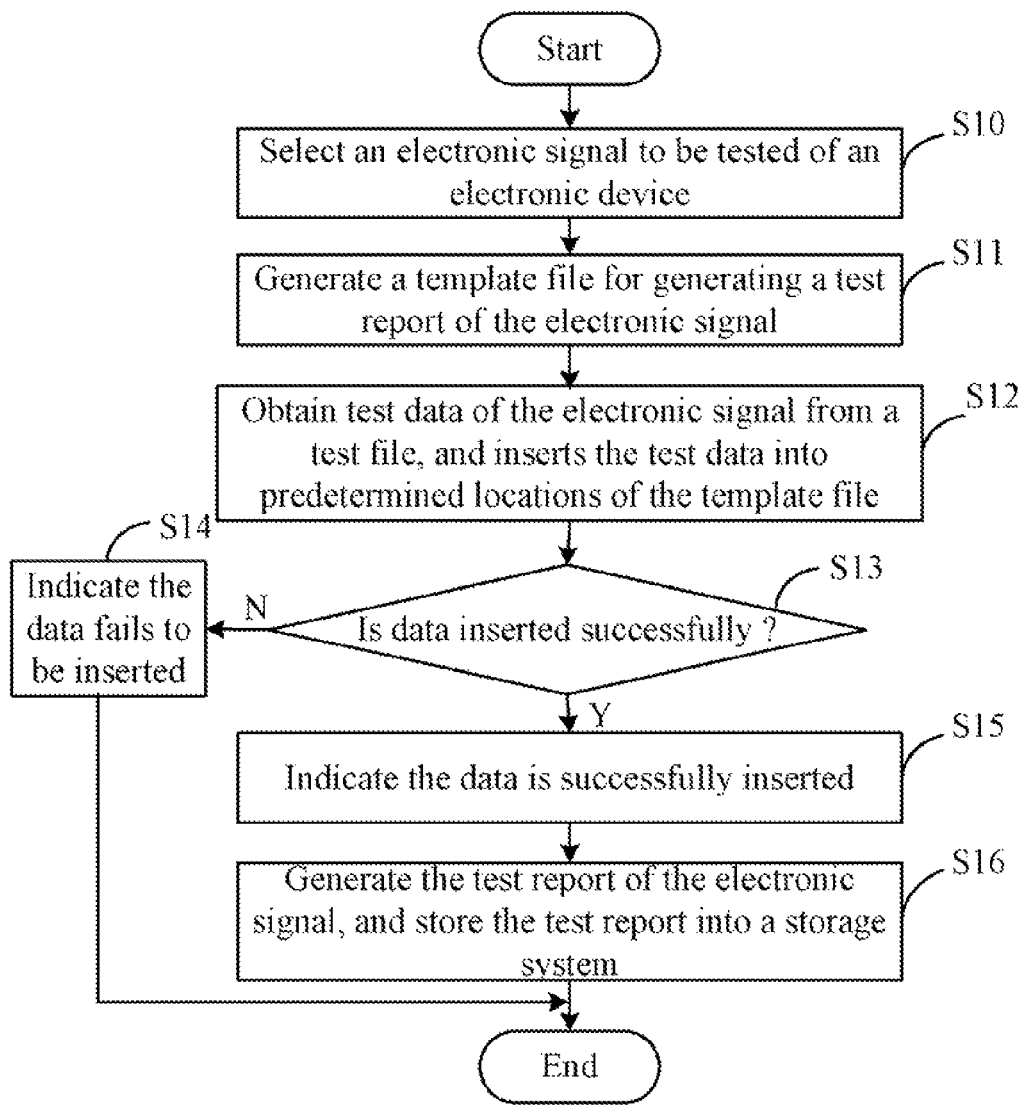
FIG. 3 is a flowchart of one embodiment of a test data management method using the system of FIG. 1.

FIG. 3 is a flowchart of one embodiment of a test data management method using the system 10 of FIG. 1. Depending on the embodiment, additional blocks may be added, others removed, and the ordering of the blocks may be changed.

In block S10, the selection 100 selects an electronic signal to be tested of an electronic device. The electronic device may be a mobile phone, a personal digital assistant (PDA), a notebook, or other hardware device to be tested. In the embodiment, the electronic signal may be, for example, a digital visual interface (DVI) signal, a universal serial bus (USB) signal, a local area network (LAN) signal, or a video graphics array (VGA) signal of the electronic device.

In block S11, the template generation module 101 generates a predefined template file used for generating a test report of the electronic signal.

In block S12, the data inserting module 102 obtains test data of the electronic signal from a test file that is generated after the electronic signal is tested, and inserts the test data into predetermined locations of the template file. Details of obtaining the test data and inserting the test data are described as following descriptions of FIG. 4. The test file may be a HTML file that is stored in the storage system 11.

In block S13, the determination module 103 determines whether the test data is successfully inserted into the template file. If the test data is successfully inserted into the template file, block S15 is implemented. If the test data fails to be inserted into the template file, block S14 is implemented.

In block S14, the notification module 104 generates a message indicating that the test data fails to be inserted into the template file, and ends the procedure.

In block S15, the notification module 104 generates a message indicating that the test data is successfully inserted into the template file.

In block S16, the report generation module 105 generates a test report of the electronic signal according to the template file and the inserted test data. When the test report is generated, the report generation module 105 stores the test report into the storage system 11, and displays the test report on the display device 13.

Figure 4:
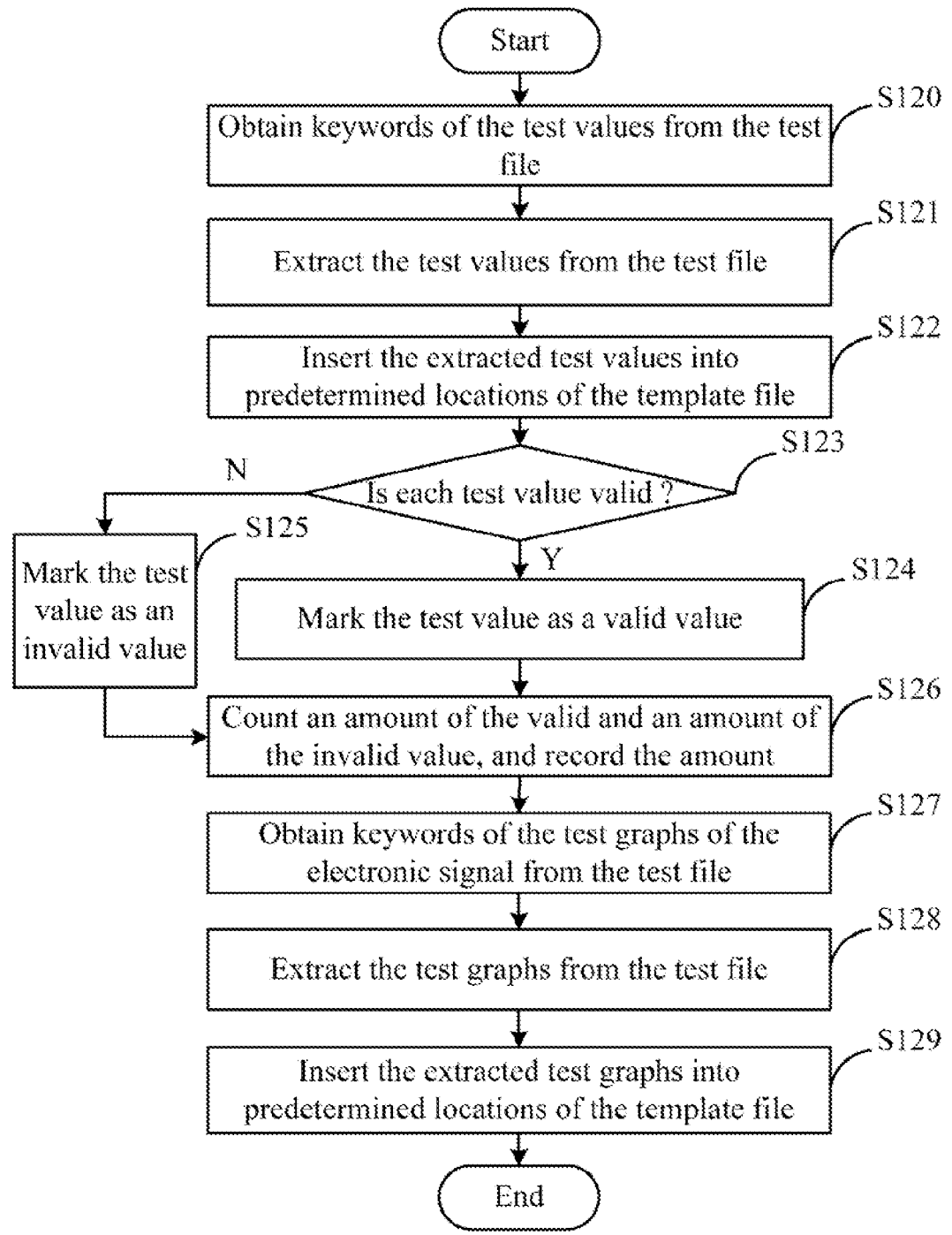
FIG. 4 is a detailed flowchart of a block S12 of FIG. 2.

FIG. 4 is a detailed flowchart of block S12 of FIG. 2. In block S120, the data inserting module 102 obtains keywords of the test values of the electronic signal from the test file. For example, the data inserting module 102 may extract a keyword "MAX" of a maximum value of the electronic signal from the text file.

In block S121, the data inserting module 102 extracts test values of the electronic signal from the test file according to the keywords of the test values. For example, the data inserting module 102 may extract a test value after the keyword "MAX" which may be a maximum value of the electronic signal from the text file.

In block S122, the data inserting module 102 inserts the extracted test values into predetermined locations of the template file. For example, the extracted maximum value may be inserted into a column named "MAX" of the template file.

In block S123, the data inserting module 102 determines whether each of the inserted test values is within a predetermined specification range. In block S124, if the test value is within the predetermined specification range, the data inserting module 102 marks the test value as a valid value using a first color, such as a green color. Otherwise, if the test value is not within the predetermined specification range, in block S125, the data inserting module 102 marks the test value as an invalid value using a second color, such as a red color.

In block S126, the data inserting module 102 counts a number of the valid values and a number of the invalid values, and records the number of the valid values and the number of the invalid values into the template file.

In block S127, the data inserting module 102 obtains keywords of the test graphs of the electronic signal from the test file, such as "fig 1" and "fig 2".

In block S128, the data inserting module 102 extracts the test graphs of the electronic signal from the test file according to the keywords of the test graphs. For example, the data inserting module 102 may extract a first test graph according to the keyword "fig 1", and a second test graph according to the keyword "fig 2", from the test file.

In block S129, the data inserting module 102 inserts the extracted test graphs into predetermined locations of the template file. For example, the first test graph may be inserted into a column named "fig 1" of the template file, and the second test picture may be inserted into a column named "fig 2" of the template file.

All of the processes described above may be embodied in, and fully automated by means of, functional code modules executed by one or more general purpose processors of the computing device 1. The code modules may be stored in any type of non-transitory computer-readable medium or other storage device. Some or all of the methods may alternatively be embodied in specialized hardware. Depending on the embodiment, the non-transitory computer-readable medium may be a hard disk drive, a compact disc, a digital video disc, a tape drive or other suitable storage medium.

Although certain embodiments of the present disclosure have been specifically described, the present disclosure is not to be construed as being limited thereto. Various changes or modifications may be made to the present disclosure without departing from the scope and spirit of the present disclosure.

What is claimed is:

1. A computerized test data management method using a computing device, the method comprising:
    selecting an electronic signal of an electronic device;
    generating a predefined template file used for generating a test report of the electronic signal;
    obtaining test data of the electronic signal from a test file stored in a storage system of the computing device, the test data comprising test values of the electronic signal;
    inserting the test data into predetermined locations of the template file;
    marking the test value as a valid value using a first color if the test value is within a predetermined specification range, or marking the test value as an invalid value using a second color if the test value is not within the predetermined specification range;
    counting a number of the valid values and a number of the invalid values, and recording the number of the valid values and the number of the invalid values in the template file;
    generating the test report of the electronic signal according to the template file and the inserted test data; and
    storing the test report into the storage system.

2. The method according to claim 1, further comprising:
    determining whether the test data is successfully inserted into the template file; and
    generating a message indicating whether the test data is successfully inserted into the template file.

3. The method according to claim 1, wherein the test data further comprises test graphs of the electronic signal.

4. The method according to claim 1, wherein the inserting step comprises:
    obtaining keywords of the test values of the electronic signal from the test file;
    extracting test values of the electronic signal from the test file according to the keywords of the test values; and
    inserting the extracted test values into predetermined locations of the template file.

5. The method according to claim 3, wherein the inserting step further comprises:
    obtaining keywords of the test graphs of the electronic signal from the test file;
    extracting the test graphs of the electronic signal from the test file according to the keywords of the test graphs; and
    inserting the extracted test graphs into predetermined locations of the template file.

6. A computing device, comprising:
    a storage system;
    at least one processor;
    one or more programs stored in the storage system and being executable by the at least one processor, the one or more programs comprising:
    a selection module that selects an electronic signal of an electronic device;

a template generation module that generates a predefined template file for generating a test report of the electronic signal;

a data inserting module that obtains test data of the electronic signal from a test file stored in the storage system and inserts the test data into predetermined locations of the template file, the test data comprising test values of the electronic signal;

the data inserting module further marks the test value as a valid value using a first color if the test value is within a predetermined specification range, or marks the test value as an invalid value using a second color if the test value is not within the redetermined specification range;

the data inserting module further counts a number of the valid values and a number of the invalid values and records the number of the valid values and the number of the invalid values in the template file; and a report generation module that generates a test report of the electronic signal according to the template file and the inserted test data, and stores the test report into the storage system.

7. The computing device according to claim 6, wherein the one or more programs further comprise:

a determination module that determines whether the test data is successfully inserted into the template file; and a notification module that generates a message indicating whether the test data is successfully inserted into the template file.

8. The computing device according to claim 6, wherein the test data further comprises test graphs of the electronic signal.

9. The computing device according to claim 6, wherein the test data is inserted by:

obtaining keywords of the test values of the electronic signal from the test file;

extracting test values of the electronic signal from the test file according to the keywords of the test values; and inserting the extracted test values into predetermined locations of the template file.

10. The computing device according to claim 8, wherein the test data is inserted by:

obtaining keywords of the test graphs of the electronic signal from the test file;

extracting the test graphs of the electronic signal from the test file according to the keywords of the test graphs; and inserting the extracted test graphs into predetermined locations of the template file.

11. A non-transitory storage medium storing a set of instructions, the set of instructions capable of being executed by a processor of a computing device, cause the computing device to perform a test data management method, the method comprising:

selecting an electronic signal of an electronic device;

generating a predefined template file for generating a test report of the electronic signal;

obtaining test data of the electronic signal from a test file stored in a storage system of the computing device, the test data comprising test values of the electronic signal;

inserting the test data into predetermined locations of the template file;

marking the test value as a valid value using a first color if the test value is within a predetermined specification range, or marking the test value as an invalid value using second color if the test value is not within the predetermined specification range;

counting a number of the valid values and a number of the invalid values, and recording the number of the valid values and the number of the invalid values in the template file;

generating the test report of the electronic signal according to the template file and the inserted test data; and storing the test report into the storage system.

12. The non-transitory storage medium according to claim 11, wherein the method further comprises:

determining whether the test data is successfully inserted into the template file; and generating a message indicating whether the test data is successfully inserted into the template file.

13. The non-transitory storage medium according to claim 11, wherein the test data further comprises test graphs of the electronic signal.

14. The non-transitory storage medium according to claim 11, wherein the inserting step further comprises:

obtaining keywords of the test values of the electronic signal from the test file;

extracting test values of the electronic signal from the test file according to the keywords of the test values; and inserting the extracted test values into predetermined locations of the template file.

15. The non-transitory storage medium according to claim 13, wherein the inserting step further comprises:

obtaining keywords of the test graphs of the electronic signal from the test file;

extracting the test graphs of the electronic signal from the test file according to the keywords of the test graphs; and inserting the extracted test graphs into predetermined locations of the template file.

* * * * *